(12) United States Patent
Popovici et al.

(10) Patent No.: US 12,414,302 B2
(45) Date of Patent: Sep. 9, 2025

(54) FERROELECTRIC DEVICE

(71) Applicant: IMEC VZW, Leuven (BE)

(72) Inventors: Mihaela Ioana Popovici, Haasrode (BE); Jan Van Houdt, Bekkevoort (BE); Amey Mahadev Walke, Heverlee (BE); Gouri Sankar Kar, Leuven (BE); Jasper Bizindavyi, Leuven (BE)

(73) Assignee: IMEC VZW, Leuven (BE)

( * ) Notice: Subject to any disclaimer, the term of this patent is extended or adjusted under 35 U.S.C. 154(b) by 456 days.

(21) Appl. No.: 18/065,335

(22) Filed: Dec. 13, 2022

(65) Prior Publication Data
US 2023/0200078 A1 Jun. 22, 2023

(30) Foreign Application Priority Data

Dec. 21, 2021 (EP) .................................... 21216277

(51) Int. Cl.
H01L 27/12 (2006.01)
C23C 16/455 (2006.01)
(Continued)

(52) U.S. Cl.
CPC ....... H10B 51/00 (2023.02); C23C 16/45536 (2013.01); H10D 1/692 (2025.01);
(Continued)

(58) Field of Classification Search
CPC ........ H10B 51/00; H10B 51/30; H10B 51/10; H10B 51/20; H10B 53/30; H10B 53/10; H10B 53/40; C23C 16/45536; C23C 16/455; C23C 16/18; C23C 16/04; C23C 16/45553; H10D 1/692; H10D 1/68; H10D 30/67; H10D 1/684; H10D 30/6755;
(Continued)

(56) References Cited

U.S. PATENT DOCUMENTS 8,107,218 B2    1/2012  Antonov et al.
10,600,808 B2 * 3/2020  Schröder ............. G11C 11/2275
(Continued)

FOREIGN PATENT DOCUMENTS

EP    3836192 A1    6/2021

OTHER PUBLICATIONS

Extended European Search Report and Written Opinion, Application No. EP 21216277.0, mailed May 19, 2022, 13 pages.
(Continued)

Primary Examiner — Nikolay K Yushin
(74) Attorney, Agent, or Firm — McDonnell Boehnen Hulbert & Berghoff LLP

(57) ABSTRACT

Example embodiments relate to ferroelectric devices. An example ferroelectric device layer structure includes a first electrode. The ferroelectric device layer structure also includes a second electrode. Additionally, the ferroelectric device layer structure includes a ferroelectric layer of hafnium zirconate (HZO). Further, the ferroelectric device layer structure includes an oxide layer of $Nb_2O_5$ or $Ta_2O_5$ arranged on the ferroelectric layer. The ferroelectric layer and the oxide layer are arranged between the first electrode and the second electrode.

20 Claims, 8 Drawing Sheets

(51) Int. Cl.
    *H10B 51/00*  (2023.01)
    *H10D 1/68*   (2025.01)
    *H10D 30/67*  (2025.01)
    *H10D 86/40*  (2025.01)
    *H10D 86/60*  (2025.01)
(52) U.S. Cl.
    CPC ....... *H10D 30/6755* (2025.01); *H10D 86/421* (2025.01); *H10D 86/60* (2025.01)
(58) Field of Classification Search
    CPC ............. H10D 30/421; H10D 30/6756; H10D 30/701; H10D 30/0414; H10D 86/421; H10D 86/40; H10D 86/60; H10D 10/692; H10D 10/68
    See application file for complete search history.

(56) References Cited

U.S. PATENT DOCUMENTS

| | | | |
|---|---|---|---|
| 11,508,755 B2 * | 11/2022 | Huang | H10D 30/0415 |
| 2008/0157157 A1 | 7/2008 | Tonomura et al. | |
| 2018/0358471 A1 | 12/2018 | Yoo | |
| 2019/0074295 A1 * | 3/2019 | Schröder | H10B 41/46 |
| 2019/0189768 A1 | 6/2019 | Liao et al. | |
| 2020/0350324 A1 | 11/2020 | Hoffmann | |
| 2022/0271046 A1 * | 8/2022 | Huang | H10D 64/033 |

OTHER PUBLICATIONS

Hoffmann, Michael, Stefan Slesazeck, and Thomas Mikolajick. "Progress and future prospects of negative capacitance electronics: A materials perspective." APL Materials 9, No. 2 (2021): 020902.

Gaddam, Venkateswarlu, Dipjyoti Das, and Sanghun Jeon. "Ferroelectricity Enhancement in Hf 0.5 Zr 0.5 O 2 Capacitors by Incorporating Ta 2 O 5 Dielectric Seed Layers." In 2020 4th IEEE Electron Devices Technology & Manufacturing Conference (EDTM), pp. 1-3. IEEE, 2020.

Chou, Chuan-Pu, Yan-Xiao Lin, Yu-Kai Huang, Chih-Yu Chan, and Yung-Hsien Wu. "Junctionless Poly-GeSn ferroelectric thin-film transistors with improved reliability by interface engineering for neuromorphic computing." ACS applied materials & interfaces 12, No. 1 (2019): 1014-1023.

Hoffmann, Michael, Franz PG Fengler, Melanie Herzig, Terence Mittmann, Benjamin Max, Uwe Schroeder, Raluca Negrea, Pintilie Lucian, Stefan Slesazeck, and Thomas Mikolajick. "Unveiling the double-well energy landscape in a ferroelectric layer." Nature 565, No. 7740 (2019): 464-467.

Kim, Si Joon, Jaidah Mohan, Scott R. Summerfelt, and Jiyoung Kim. "Ferroelectric Hf0. 5Zr0. 5O2 thin films: a review of recent advances." Jom 71, No. 1 (2019): 246-255.

Kozodaev, Maxim G., Anna G. Chernikova, Evgeny V. Korostylev, Min Hyuk Park, Roman R. Khakimov, Cheol S. Hwang, and Andrey M. Markeev. "Mitigating wakeup effect and improving endurance of ferroelectric HfO2—ZrO2 thin films by careful La-doping." Journal of Applied Physics 125, No. 3 (2019): 034101.

Chernikova, Anna G., Maxim G. Kozodaev, Dmitry V. Negrov, Evgeny V. Korostylev, Min Hyuk Park, Uwe Schroeder, Cheol Seong Hwang, and Andrey M. Markeev. "Improved ferroelectric switching endurance of La-doped Hf0. 5Zr0. 5O2 thin films." ACS applied materials & interfaces 10, No. 3 (2018): 2701-2708.

Chernikova, Anna G., Maxim G. Kozodaev, Roman R. Khakimov, Sergey N. Polyakov, and A. M. Markeev. "Influence of ALD Ru bottom electrode on ferroelectric properties of Hf0. 5Zr0. 5O2-based capacitors." Applied Physics Letters 117, No. 19 (2020): 192902.

Mehmood, Furqan, Thomas Mikolajick, and Uwe Schroeder. "Lanthanum doping induced structural changes and their Implications on ferroelectric properties of Hf1—xZrxO2 thin film." Applied Physics Letters 117, No. 9 (2020): 092902.

Sahoo, Satyajeet. "Conduction and switching behavior of e-beam deposited polycrystalline Nb2O5 based nano-ionic memristor for non-volatile memory applications." Journal of Alloys and Compounds 866 (2021): 158394.

Park, Min Hyuk, Han Joon Kim, Yu Jin Kim, Young Hwan Lee, Taehwan Moon, Keum Do Kim, Seung Dam Hyun, Franz Fengler, Uwe Schroeder, and Cheol Seong Hwang. "Effect of Zr content on the wake-up effect in Hf1—x Zr x O2 films." ACS applied materials & interfaces 8, No. 24 (2016): 15466-15475.

* cited by examiner

FERROELECTRIC DEVICE

CROSS-REFERENCE TO RELATED APPLICATIONS

The present application is a non-provisional patent application claiming priority to European Patent Application No. EP 21216277.0, filed Dec. 21, 2021, the contents of which are hereby incorporated by reference.

FIELD OF THE DISCLOSURE

The present disclosure relates to a ferroelectric device layer structure that may be included in a ferroelectric device, for instance, a metal-ferroelectric-metal (MFM) capacitor, a ferroelectric random access memory (Fe-RAM), or a ferroelectric field effect transistor (FeFET). The ferroelectric device is based on hafnium zirconate (HZO) and either $Nb_2O_5$ or $Ta_2O_5$, i.e., it includes a HZO layer and a layer of $Nb_2O_5$ or $Ta_2O_5$. The present disclosure also relates to a method of manufacturing such a ferroelectric device.

BACKGROUND

A non-volatile data storage (generally, a memory device) can be obtained using ferroelectric oxides, due to their capacity to store binary information in two distinct polarization states. These polarization states arise, for example, in hafnium oxide ($HfO_2$) and in HZO. The cause of these polarization states is the formation of a non-centrosymmetric polar orthorhombic Pca21 phase (short "orthorhombic crystal structure"), with four oxygen atoms in a unit cell that have two stable positions.

A large memory window may include a high remnant polarization ($2P_R$) of the ferroelectric oxide, which should be at least 10 $\mu C/cm^2$, and may also include a high endurance in order to maintain such a high $2P_R$ for at least 1E+9 cycles (for around 10 years lifetime) of the memory device. The fatigue is a degradation phenomenon in the ferroelectric oxide, which causes the remnant polarization of the ferroelectric oxide to decrease. The endurance is a measure of how many times the ferroelectric oxide can be cycled (i.e., switched between the two distinct polarization states), until significant fatigue sets in (which may make the two polarization states less distinct), i.e., it suffers a permanent breakdown.

It may be useful to stabilize the orthorhombic crystal structure for a fatigue-free high endurance and a high remnant polarization.

SUMMARY

Example embodiments provide an improved ferroelectric device layer structure.

Example embodiments provide a ferroelectric device layer structure comprising: a first electrode and a second electrode; a ferroelectric layer of hafnium zirconate (HZO); and an oxide layer of $Nb_2O_5$ or $Ta_2O_5$ arranged on the ferroelectric layer; wherein the ferroelectric layer and the oxide layer are arranged between the first electrode and the second electrode.

By the oxide layer being arranged on the ferroelectric layer, the oxide layer may be above, below, or both above and below the ferroelectric layer compared to a stacking direction of the layer structure, e.g., in relation to a substrate.

The oxide layer(s) are arranged in direct contact with the ferroelectric layer, i.e., without any interfacial layer(s) in between.

The oxide layer being $Nb_2O_5$ or $Ta_2O_5$ enables an oxygen-rich interfacial layer between the ferroelectric layer and an electrode, which prevents oxygen scavenging by the electrode. Accordingly, endurance is improved.

The oxide layer being $Nb_2O_5$ or $Ta_2O_5$ further enables an enhanced in-plane tensile strain in the ferroelectric layer based on a lattice mismatch between the oxide layer and the ferroelectric layer. Accordingly, remnant polarization is increased.

The oxide layer being $Nb_2O_5$ or $Ta_2O_5$ further enables having fewer pinned domains in the ferroelectric layer, which improves wake-up characteristics from the pristine state (i.e., no cycling yet).

Typically, (doped) HZO shows pinched polarization vs electrical field (E-field) loops (PE-loop) as a result of the pinning of (some fraction of) the ferroelectric domains due to local E-field variations that arise from the presence of pinning centers (e.g., defects) inside the HZO layer. These pinched PE-loops typically result in reduced values of $2P_R$ (remnant polarization). The introduction of $Nb_2O_5$ or $Ta_2O_5$ as a capping layer on top of the (doped) HZO layer reduces the fraction of initially pinned ferroelectric domains, thereby allowing for a more open (i.e., less pinched) PE-loop and a higher $2P_R$ in the pristine state.

According to some embodiments, at least 30% of the ferroelectric layer and the oxide layer has an orthorhombic crystal structure.

This enables more of the ferroelectric layer to be stabilized with an orthorhombic crystal structure, thereby further improving remnant polarization.

According to some embodiments, the device layer structure further comprises an interfacial layer, which is arranged between the oxide layer and the second electrode.

The interfacial layer may play the role of a channel in high density and low power consumption non-volatile memories, such as a FeFET. The interfacial layer may further prevent oxygen scavenging by the electrode, thereby mitigating fatigue, According to some embodiments, the ferroelectric layer is a doped HZO layer.

The dopants may, e.g., be La, Gd, Y, etc.

Dopants may further stabilize the orthorhombic crystal structure to minimize or prevent fatigue, reduce leakage, extend endurance, and improve remnant polarization.

According to some embodiments, the oxide layer is between 0.5-3 nm thick.

Such a thickness has shown to provide the least fatigue and longer endurance.

Example embodiments provide a ferroelectric device comprising the layer structure according to the previous aspect. The ferroelectric device further comprises a doped semiconductor substrate having a front side and a back side, wherein the layer structure is arranged on the front side.

An aluminum layer may be arranged on the back side. The aluminum layer may reduce contact issues when performing electrical measurements.

Example embodiments provide a method for fabricating a ferroelectric device. The method comprises: forming a ferroelectric device layer structure comprising: a first electrode and a second electrode; a ferroelectric layer of hafnium zirconate (HZO); and an oxide layer of $Nb_2O_5$ or $Ta_2O_5$ arranged on the ferroelectric layer; wherein the ferroelectric layer and the oxide layer are arranged between the first electrode and the second electrode. The method further comprises: annealing the layers of the ferroelectric device layer structure at a temperature in a range of 350° C.-750° C. if the oxide layer is made of $Nb_2O_5$ and in a range of 350° C.-900° C. if the oxide layer is made of $Ta_2O_5$.

After the annealing, the layers of the device layer structure may be completely crystallized.

By annealing both the oxide layer and the ferroelectric layer at the same time, they are simultaneously crystallized, which enables more of the ferroelectric layer to be stabilized with an orthorhombic crystal structure, thereby further improving remnant polarization.

According to some embodiments, forming a ferroelectric device layer structure comprises: depositing a metal for forming the first electrode on a front side of a semiconductor substrate; depositing HZO for forming the ferroelectric layer on the first electrode; depositing $Nb_2O_5$ or $Ta_2O_5$ for forming the oxide layer on the ferroelectric layer; and then depositing a metal for forming the second electrode.

By depositing the layers of the device layer structure accordingly, various orderings of the layers are enabled. This is because growing $Nb_2O_5$ or $Ta_2O_5$ on a metal forming the electrodes, the (Nb or Ta)/O atomic ratio may be different than when growing on HZO. This may affect the stoichiometry and crystal structure causing less of the oxide layer to be $Nb_2O_5$ or $Ta_2O_5$ (with pentavalent cations) or in an orthorhombic crystal structure.

According to some embodiments, the method further comprises forming an aluminum layer on a back side of the semiconductor substrate The aluminum layer may reduce contact issues when performing electrical measurements.

According to some embodiments, the depositing steps use atomic layer deposition (ALD).

Any type of ALD may be used, such as plasma enhanced ALD and/or thermal ALD.

By using ALD for the depositing steps, the entire ferroelectric device may be fabricated using ALD, which simplifies manufacturing.

According to some embodiments, the ALD is performed with a reactor temperature in a range of 150° C.-450° C.

The temperature used may depend on the precursors used in the depositing steps. Notably, each of the above layers may be deposited at a different temperature, as long as all the layers are deposited within the specified temperature range.

According to some embodiments, the method further comprises: depositing additional metal on the second electrode after the annealing step; and patterning the metal to form the second electrode.

Thereby, the whole metal structure, i.e., including the metal deposited as the second electrode and the additional metal, is patterned to form the second electrode.

This enables a larger (thicker) top electrode that may be useful, e.g., to enable sufficient optical contrast when probing the ferroelectric device for electrical measurements or for back end of line processing.

BRIEF DESCRIPTION OF THE DRAWINGS

The above, as well as additional features, will be better understood through the following illustrative and non-limiting detailed description, with reference to the appended drawings. In the drawings like reference numerals will be used for like elements unless stated otherwise.

DETAILED DESCRIPTION

Figure 1A:
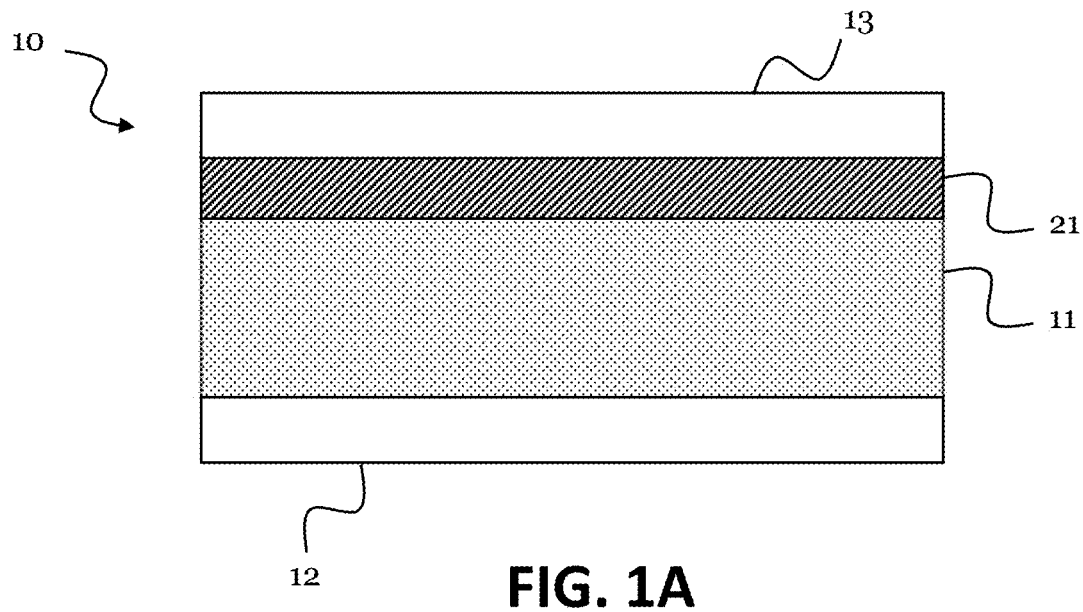
FIG. 1A is a schematic illustration of a device layer structure, according to example embodiments.

FIG. 1A illustrates a device layer structure 10 that includes a first electrode 12, a ferroelectric layer 11 of hafnium zirconate (HZO), an oxide layer 21 of $Nb_2O_5$ or $Ta_2O_5$, and a second electrode 13.

The oxide layer 21 is arranged on the ferroelectric layer 11, with the oxide layer 21 being in direct contact and above the ferroelectric layer 11. Both the ferroelectric layer 11 and the oxide layer 21 are arranged between the first electrode 12 and the second electrode 13.

Figure 1B:
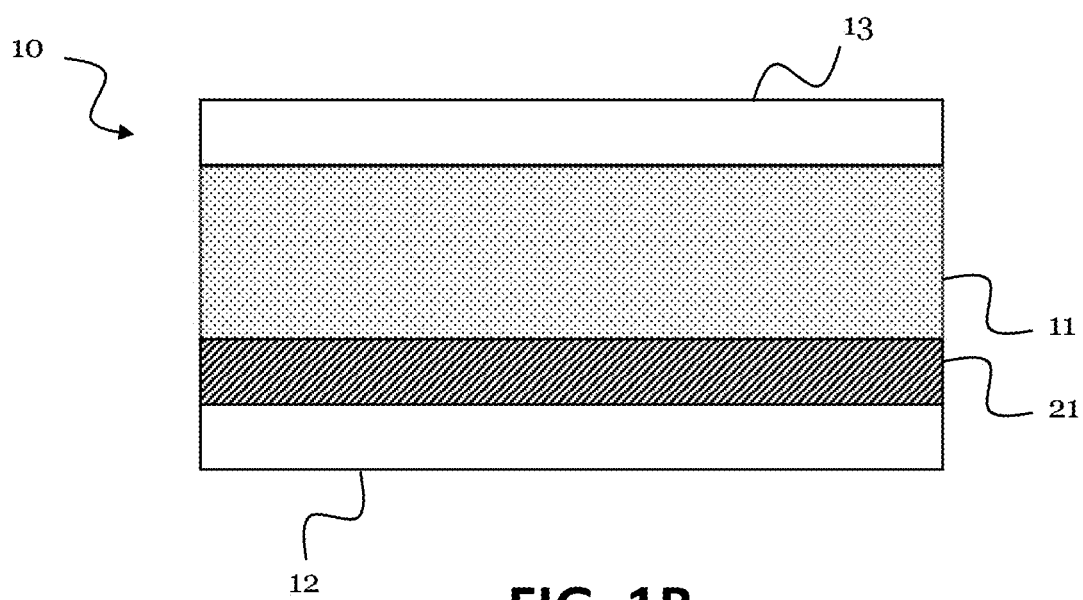
FIG. 1B is a schematic illustration of a device layer structure, according to example embodiments.

FIG. 1B illustrates a similar device layer structure 10, where the oxide layer 21 is arranged on the ferroelectric layer 11, with the oxide layer 21 being in direct contact and under the ferroelectric layer 11.

In another embodiment (not shown), the device layer structure 10 may include first and second oxide layers both being arranged on the ferroelectric layer 11. The first oxide layer is arranged in direct contact and under the ferroelectric layer 11. The second oxide layer is arranged in direct contact and above the ferroelectric layer 11.

The following applies to any of these embodiments.

The first electrode 12 may also be referred to as bottom electrode, and the second electrode 13 may also be referred to as a top electrode. Thereby, top and bottom may relate to a fabrication direction or growth direction of the ferroelectric device layer structure 10. Both electrodes 12, 13 may be made of a metal or of a conductive oxide, such as titanium nitride (TiN), titanium, tungsten, or aluminum. The electrodes 12, 13 may have a thickness (in growth direction) of 5-30 nm, such as 10 nm, and may have different thicknesses.

The ferroelectric layer 11 may have at least two non-zero remnant polarization charge states. A thickness (in growth direction) of the ferroelectric layer 11 may be between 3-15 nm (e.g., between 8.5-12.5 nm).

The oxide layer 21 may have majority portion of stoichiometric $Nb_2O_5$ or $Ta_2O_5$ and may have a thickness (in growth direction) of 0.5-3 nm, such as 2 nm.

A thickness of 2 nm may provide for a maximized initial $2P_R$ compared to other thicknesses, i.e., having enhanced wake-up characteristics.

At least 30% (e.g., at least 40%, at least 50%, or at least 75%) of the ferroelectric layer 11 may have an orthorhombic crystal structure. When the ferroelectric layer 11 has an orthorhombic crystal structure, the different directions that the atoms are separated in (usually) are separated at a different distance. The orthorhombic crystal structure may thereby be said to be strained by definition. The different oxygen atoms are at different distances, which creates a dipole that increases remnant polarization ($2P_R$).

The added strain from a lattice mismatch between the ferroelectric layer 11 and the oxide layer 21 thereby gives more orthorhombic crystal structure in HZO rather than cubic, monoclinic, and triagonal.

At least 30% (e.g., at least 40%, at least 50%, or at least 75%) of the oxide layer 21 may have an orthorhombic crystal structure. By the oxide layer 21 having an orthorhombic crystal structure, an orthorhombic crystal structure of the ferroelectric layer 11 may be stabilized.

Further, the oxide layer 21 being oxygen-rich may prevent oxygen scavenging by the second electrode 13, which in turn improves endurance. Energy-dispersive X-ray spectroscopy (EDS) has been used to verify that the surface of the oxide layer 21 interfacing with the second electrode 13 has a slightly lower stoichiometric degree of oxygen, which indicates the second electrode 13 scavenging oxygen from the oxide layer 21 instead of the ferroelectric layer 11.

The ferroelectric layer 11 may be doped HZO. The ferroelectric layer 11 is doped with a combination of an element selected from the lanthanide series and/or a rare earth element. In some embodiments, the elements (dopants) in the doped HZO layer 11 may include one or more of lanthanum, gadolinium, yttrium, scandium, and praseodymium.

A total dopant concentration in the doped HZO layer 11 may be equal to or smaller than 2 atomic %, in particular, it may be in a range of 0.7-1.8 atomic %.

The dopants may decrease Ec and reduce leakage.

Figure 2:
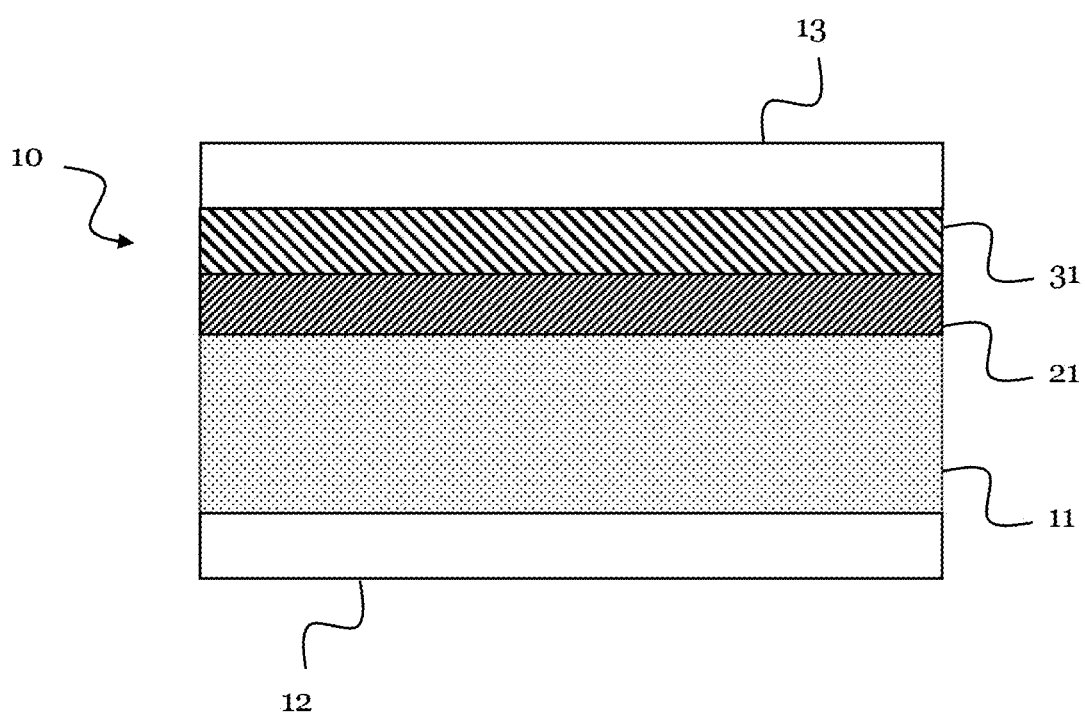
FIG. 2 is a schematic illustration of a device layer structure, according to example embodiments.

FIG. 2 illustrates a device layer structure 10 similar to the one in FIG. 1A, where the device layer structure 10 further includes an interfacial layer 31.

The interfacial layer 31 is arranged between the oxide layer 21 and the second electrode 13 in FIG. 2. However, in embodiments similar to the one in FIG. 1B where the oxide layer 21 is arranged below the ferroelectric layer 11, the interfacial layer 31 may be arranged between the oxide layer 21 and the second electrode 12.

The interfacial layer 31 may include a layer of oxide-semiconductor materials (i.e., metallic oxide materials that may be used as semiconductors), such as indium gallium zinc oxide (IGZO), indium tin oxide (ITO), $In_2O_3$, or indium tungsten oxide (IWO). The interfacial layer 31 may include a 2D semiconductor layer, like graphene or $MX_2$ (e.g., $MoS_2$), or a layer of another oxide (e.g., $ZrO_2$, $HfO_2$, Zr-rich HZO, or Hf-rich HZO). The interfacial layer 31 may be doped with at least one element from the lanthanide series and/or at least one rare earth element. For example, the interfacial layer 31 may be a $ZrO_2$ layer and the doped HZO layer 11 may be stoichiometric (50%) or Hf-rich (>50%).

The interfacial layer 31 may have a thickness of 4-12 nm.

Figure 3:
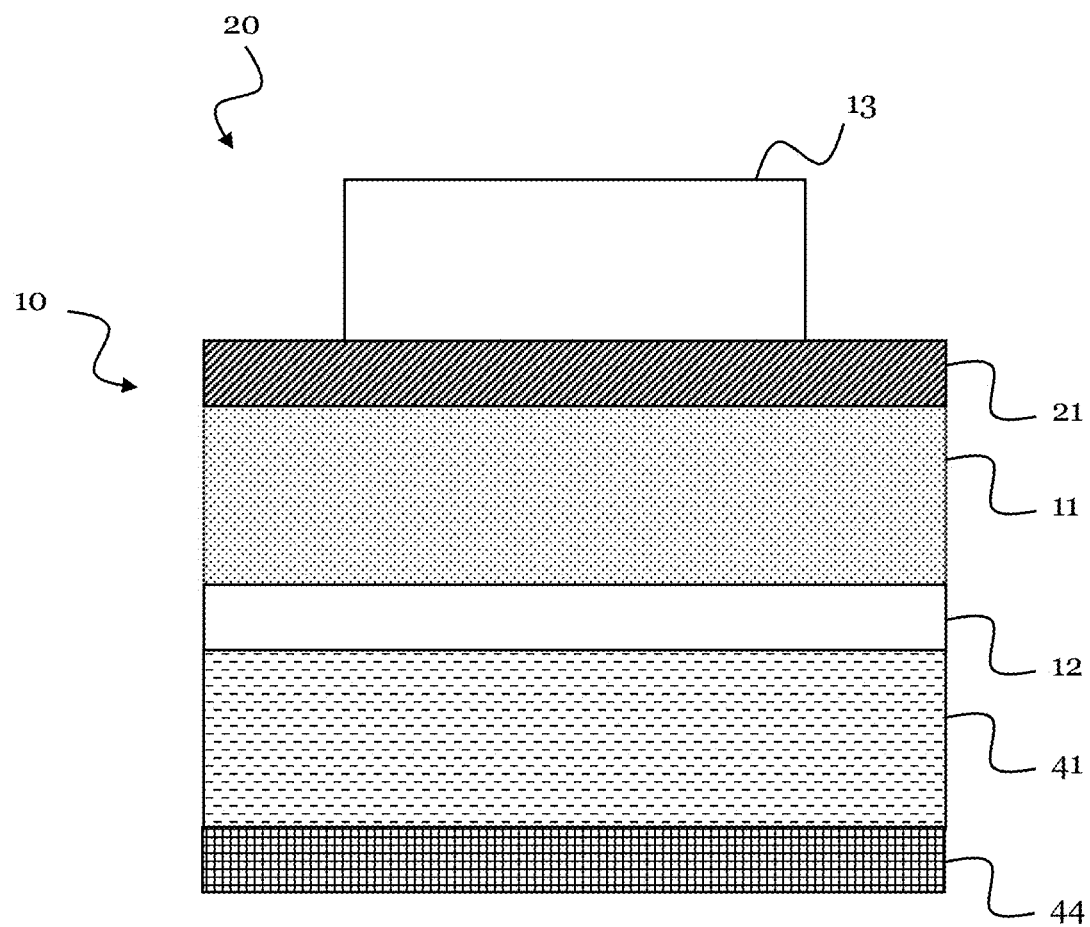
FIG. 3 is a schematic illustration of a device, according to example embodiments.

FIG. 3 illustrates a ferroelectric device 20 that includes a layer structure 10 as described in relation to FIGS. 1A, 1B, and 2. In particular, the ferroelectric device 20 of FIG. 3 includes a layer structure 10 that includes an oxide layer 21 arranged above the ferroelectric layer 11 and a second electrode 13 being thicker (in growth direction) and having a different shape than the first electrode 12. In FIG. 3, the first electrode 12 is 10 nm thick and the second electrode 13 is 30 nm thick.

The ferroelectric device 20 may be a metal-ferroelectric-metal (MFM) capacitor, a metal-ferroelectric-semiconductor-metal (MFSM) capacitor, a ferroelectric memory such as a ferroelectric random access memory (FE-RAM) or a ferroelectric flash memory, or a ferroelectric field effect transistor (FeFET).

The ferroelectric device 20 further includes a doped semiconductor substrate 41. The doped semiconductor substrate 41 has a front side and a back side, wherein the layer structure 10 is arranged on the front side and an aluminum layer 44 is arranged on the back side. The front side is upwards in a stacking direction (i.e., growth direction) and the back side is downwards in FIG. 3, however other variations are also possible.

The doped semiconductor substrate 41 may, e.g., be made of boron-doped silicon. The semiconductor substrate may be made of Si, GaAs, sapphire, InP, Germanium, wafer or silicon on insulator (SOI) wafer, or a glass substrate.

The aluminum layer 44 may have a thickness (in growth direction) of 500 nm.

The second electrode 13 may have been patterned to have a different shape than the first electrode 12 and the layer structure 10 as will be described further in relation to FIG. 4.

Figure 4:
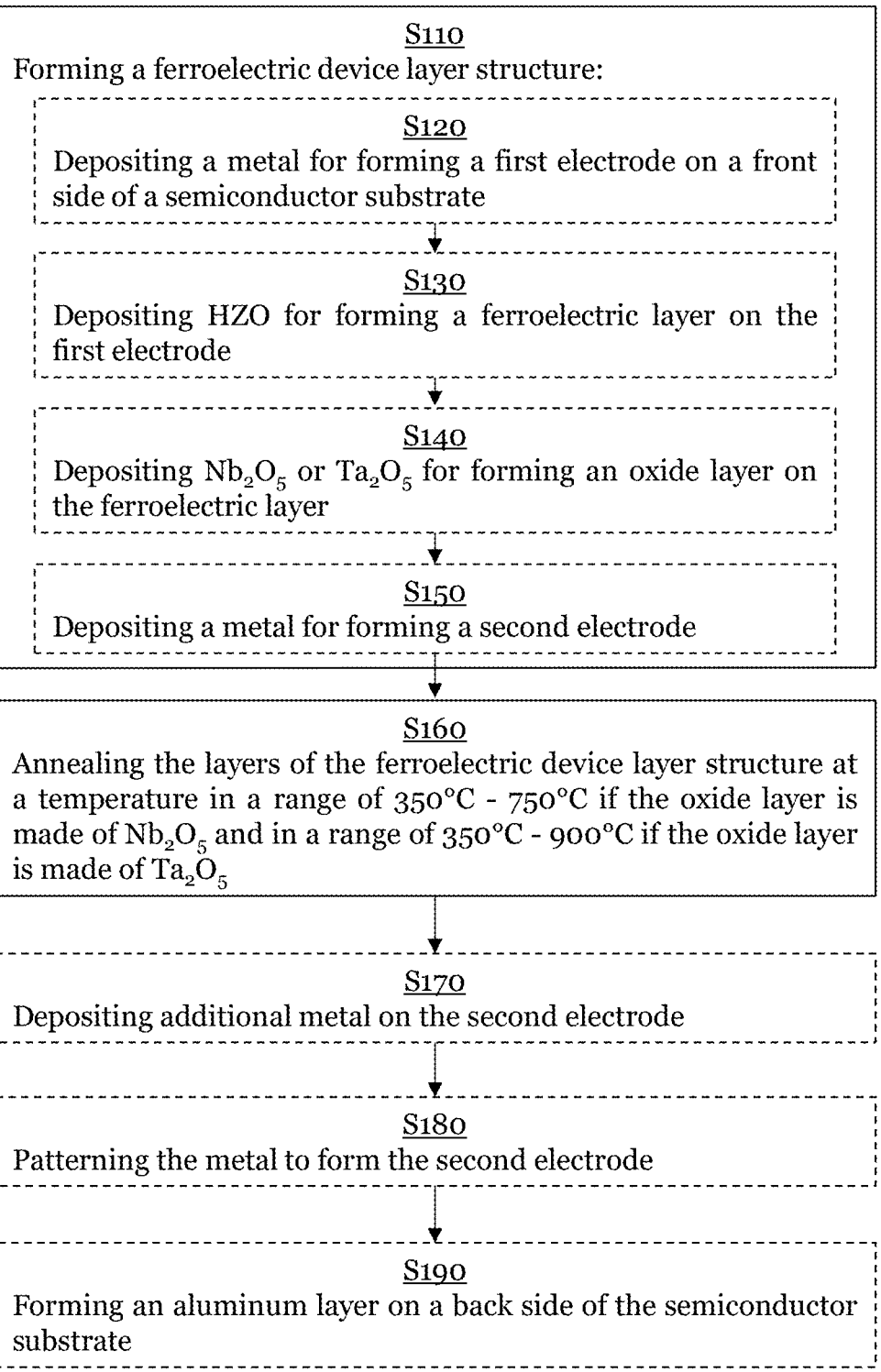
FIG. 4 is a schematic flowchart of a method, according to example embodiments.

FIG. 4 shows a flowchart of a method 100 for fabricating a ferroelectric device 20. The ferroelectric device 20 may be as described in relation to FIG. 3. The steps shown are sequential, however other orderings are possible. Steps shown in dashed lined boxes are optional.

A first step includes forming S110 a ferroelectric device layer structure. The ferroelectric device layer structure may be as described in relation to FIGS. 1A, 1B, and 2.

Forming S110 a ferroelectric device layer structure may include a number of depositing steps S120-S150. These depositing steps S120-S150 may be performed on a semiconductor substrate, which may be doped.

First, a metal is deposited S120 on a front side of the semiconductor substrate for forming a first electrode. This metal may, e.g., be TiN.

Then, HZO is deposited S130 on the metal for forming a ferroelectric layer. The HZO may be doped. The precursors used may be $HfCl_4$, $ZrCl_4$, and HZO or any metalorganic compound with Hf and Zr such as cyclopentadienyl, amidinates, etc. in combination with HZO, ozone ($O_3$), or oxygen plasma.

Then, $Nb_2O_5$ or $Ta_2O_5$ is deposited S140 on the HZO for forming an oxide layer on the ferroelectric layer. This step S140 may switch ordering with the previous step S130 in some embodiments.

Next, a metal is deposited S150 on the oxide layer. This may form a second electrode and the metal may, e.g., be TiN.

The depositing steps S120-S150 may use atomic layer deposition (ALD). This may be any type of ALD, such as plasma enhanced ALD and/or thermal ALD. The reactor temperature for the ALD steps S120-S150 may vary depending on the material deposited. For example, depositing S130 HZO may be done at 300° C. and depositing S140 $Nb_2O_5$ may be done at 250° C.

After forming the ferroelectric device layer structure, the layers of the ferroelectric device layer structure are annealed S160. This includes heating the ferroelectric device layer structure, e.g., in an annealing oven, to crystallize the layers of the ferroelectric device layer structure. Annealing S160 the layers of the layer structure all at once (i.e., after the layer structure is formed) ensures that the ferroelectric layer and the oxide layer crystallizes simultaneously.

By crystallizing the ferroelectric layer and the oxide layer simultaneously, more of the ferroelectric layer may stabilize with an orthorhombic crystal structure. Accordingly, at least 30% of the ferroelectric layer will have an orthorhombic crystal structure.

To crystallize the oxide layer, the annealing temperature is in a range of 350° C.-750° C. if the oxide layer is made of $Nb_2O_5$ and in a range of 350° C.-900° C. if the oxide layer is made of $Ta_2O_5$. In an embodiment, the annealing temperature is in a range of 400° C.-550° C. if the oxide layer is made of $Nb_2O_5$ and in a range of 350° C.-750° C. if the oxide layer is made of $Ta_2O_5$.

The minimum values of the temperature ranges correspond to a minimum temperature to crystallize the oxide and the maximum values correspond to an appearance of unwanted monoclinic phase into the HZO layer.

After annealing S160, additional metal may be deposited S170 on the metal for forming the second electrode. This metal may be the same as the previously deposited S150 metal and may be performed using ALD.

The metal for forming the second electrode, which may or may not include the additional metal deposited S170 in a previous step, may be patterned S180 by, e.g., using etching or lithography.

An aluminum layer may be formed S190 on a back side of the semiconductor layer, e.g., using back-side metallization.

Figure 5A:
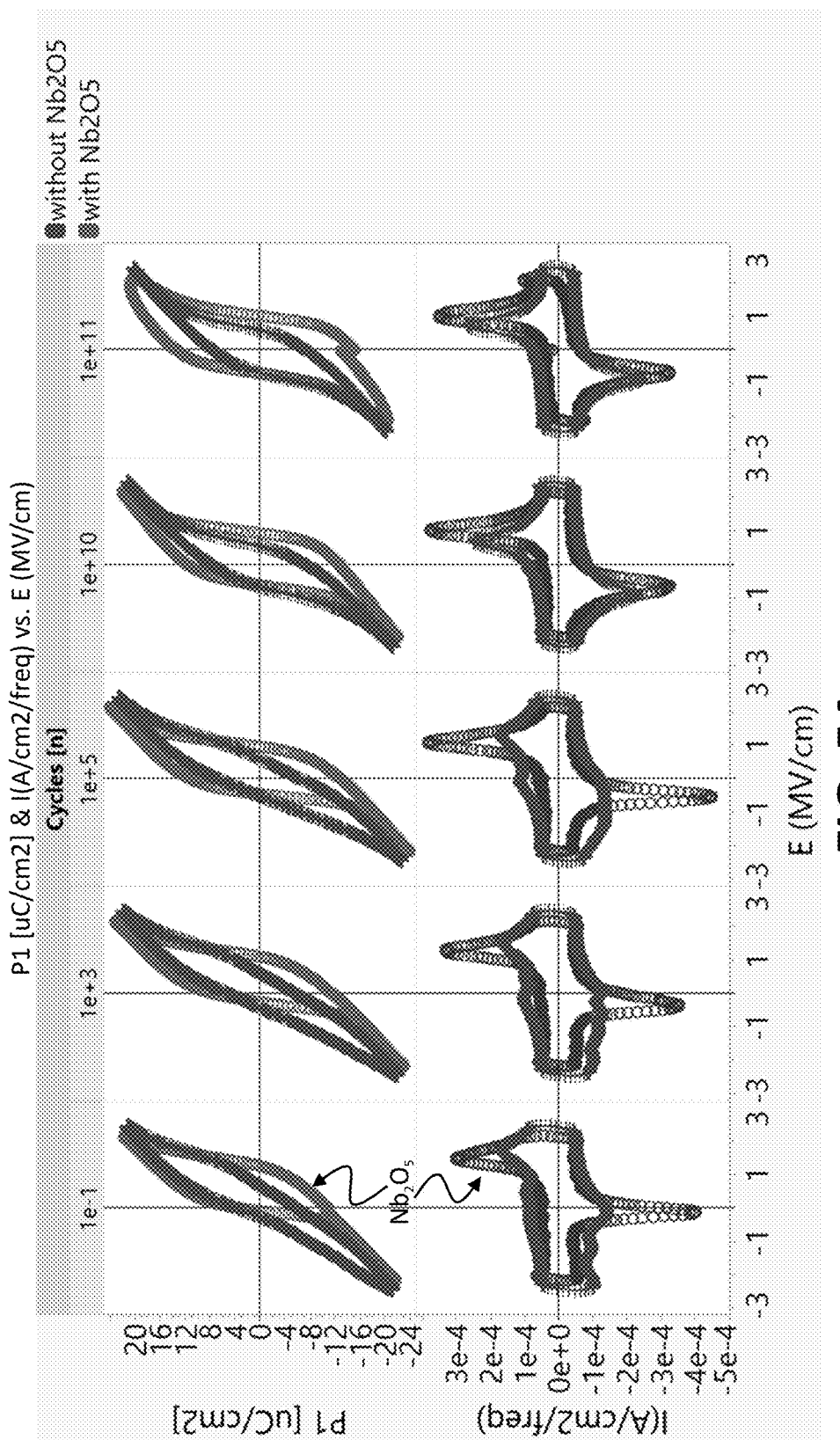
FIG. 5A is a plot comparing capacitors that include HZO either with or without $Nb_2O_5$ capping showing evolution of polarization and current density versus electric field with a number of bipolar fatigue cycles, according to example embodiments.
Figure 5B:
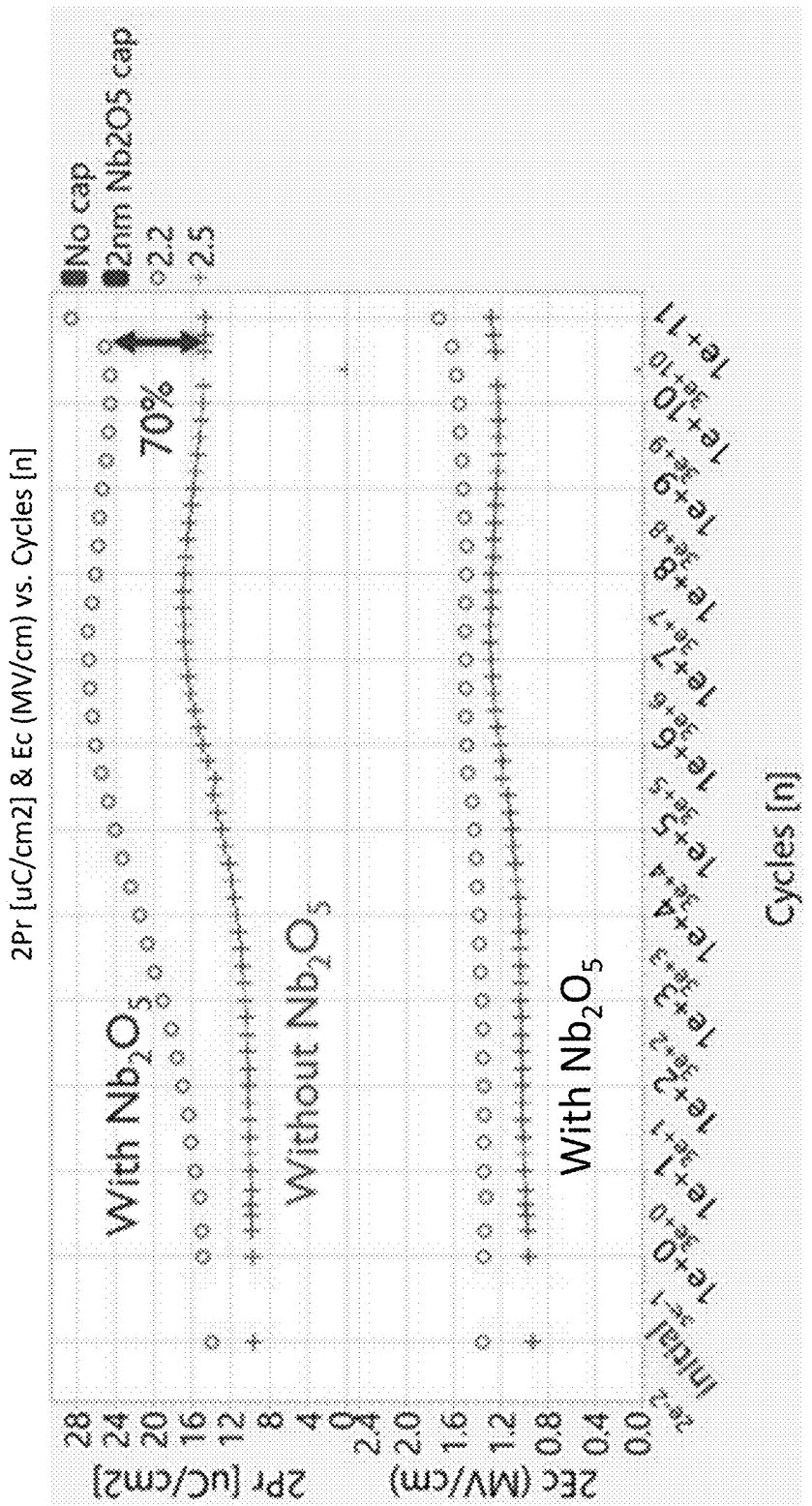
FIG. 5B is a plot showing an evolution of remnant polarization ($2P_R$) and coercive field (Ec) with a number bipolar fatigue cycles, demonstrating that a higher remnant polarization ($2P_R$) and early wake-up may be obtained with an oxide layer that includes $Nb_2O_5$ on top of HZO, according to example embodiments.

FIGS. 5A and 5B show plots comparing a ferroelectric device layer stack according to FIGS. 1A, 1B, 2, and 3 to a reference.

FIG. 5A shows a plot showing an evolution of polarization and current density when bipolar fatigue cycles with an amplitude between 2.2-2.4V is applied to TiN—HZO (with or without $Nb_2O_5$ cap)-TiN capacitors, demonstrating wake-up characteristics over time. The larger and less pinched PE curves labeled with $Nb_2O_5$ correspond to a ferroelectric device (capacitor) that includes a device layer stack that includes HZO capped with $Nb_2O_5$ according to example embodiments and the smaller and more pinched PE curves correspond to a device layer stack without such an oxide layer capping the HZO layer.

The less pinched PE curves in the PE characteristics on the top side of FIG. 5A and the presence of larger and more well-defined current peaks in the IV characteristics on the bottom side of FIG. 5A in the case of a device with HZO capped with $Nb_2O_5$ that has been cycled once demonstrate improved wake-up characteristics, as these larger current peaks indicate that a larger fraction of the ferroelectric domains have been able to switch at once. Larger current peaks thereby facilitate a clearer distinction between the two different polarization states of the ferroelectric layer.

FIG. 5B shows a plot showing $2P_R$ and $2E_c$ as a function of the number of applied bipolar fatigue cycles.

FIG. 5B shows that the remnant polarization (2Pr) of the ferroelectric layer 11 may be maintained at 10 $\mu C/cm^2$ or even higher, when the endurance is equal to or greater than 1E+5 cycles (e.g., greater than 1E+9 cycles or greater than 1E+11 cycles). In particular, an almost fatigue free behavior with a remnant polarization (2Pr) of above 20 $\mu C/cm^2$ or a fatigue free behavior with a remnant polarization (2Pr) of at least 24 $\mu C/cm^2$ may be achieved in the ferroelectric device layer structure.

Such a large remnant polarization (2Pr) may further mean that an area of the ferroelectric device layer structure may be reduced without sacrificing a differentiation of the polarization states of the ferroelectric layer.

Accordingly, the oxide layer is shown to greatly improve fatigue resistance, i.e., around 70% improvement at 1E+11 cycles.

Figure 6A:
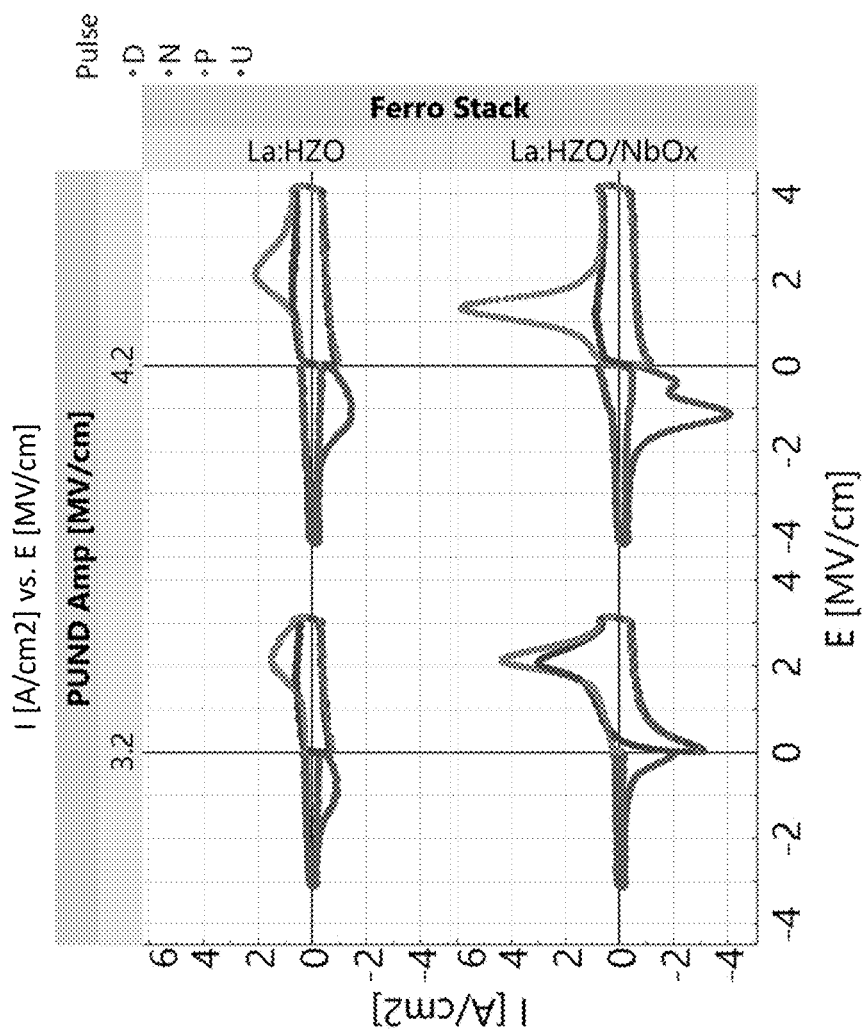
FIG. 6A is a plot comparing PUND measurement current density of a metal-HZO-IGZO-metal and metal-HZO-$Nb_2O_5$-IGZO-metal capacitor at two amplitudes of PUND pulses, demonstrating that much higher polarization switching currents may be obtained when HZO is capped with $Nb_2O_5$, according to example embodiments.
Figure 6B:
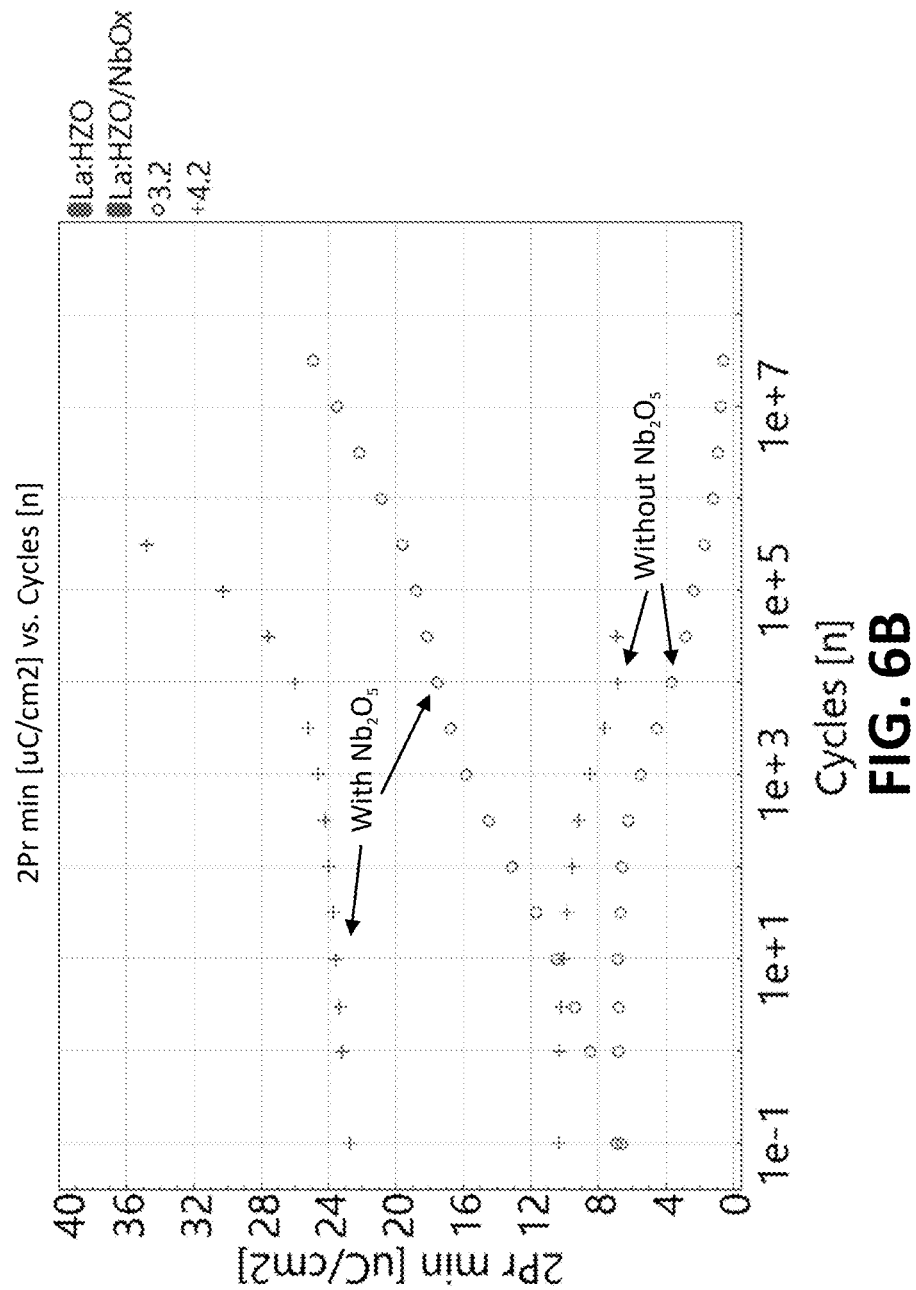
FIG. 6B is a plot showing an evolution of remnant polarization versus a number of bipolar fatigue cycles at two amplitudes of bipolar electric field cycling, demonstrating that capping of HZO with $Nb_2O_5$ offers a very high remnant polarization upon wake-up and prevents fatigue over time, according to example embodiments.

FIGS. 6A and 6B show plots comparing a ferroelectric device layer stack according to FIGS. 1A, 1B, 2, and 3 to a reference. The ferroelectric device layer stack of FIGS. 6A and 6B and the reference layer stack further include an interfacial layer as in FIG. 2.

FIG. 6A shows a plot showing a comparison of PUND measurement on TiN-HZO (with or without $Nb_2O_5$ cap)-IGZO-TiN capacitors at two amplitudes (3.2 and 4.2 MV/cm) of measurement pulses. Different (switching and non-switching PUND) pulses are shown overlapping each other, with different amplitudes in the left-hand side compared to the right-hand side of FIG. 6A. The bottommost plots correspond to a device layer stack that includes $Nb_2O_5$ according to example embodiments and the topmost plots correspond to a device layer stack without such an oxide layer.

The larger current peaks in the bottom most plots indicate that a larger number of ferroelectric domains are available for switching when HZO is capped with $Nb_2O_5$.

FIG. 6B shows a plot showing $2P_R$ versus a number of cycles, demonstrating fatigue resistance over time. The topmost data points correspond to a device layer stack that includes $Nb_2O_5$ according to example embodiments and the lowermost data points correspond to a device layer stack without such an oxide layer.

The data points not trending downwards indicate an improved fatigue resistance.

In the above, a limited number of examples have been described. However, as is readily appreciated, other examples than the ones disclosed above are equally possible within the scope of the present disclosure, as defined by the appended claims.

What is claimed is:

1. A ferroelectric device layer structure comprising:
   a first electrode;
   a second electrode;
   a ferroelectric layer of hafnium zirconate (HZO); and
   an oxide layer of $Nb_2O_5$ or $Ta_2O_5$ arranged on the ferroelectric layer,
   wherein the ferroelectric layer and the oxide layer are arranged between the first electrode and the second electrode, and
   wherein the ferroelectric layer and the oxide layer have an orthorhombic crystal structure:
      producible by an annealing step performed at an annealing temperature in a range of 350° C.-750° C. if the oxide layer is made of $Nb_2O_5$; and
      producible by an annealing step performed at corresponding to an annealing temperature in a range of 350° C.-900° C. if the oxide layer is made of $Ta_2O_5$.

2. The ferroelectric device layer structure according to claim 1, wherein at least 30% of the ferroelectric layer and the oxide layer have the orthorhombic crystal structure.

3. The ferroelectric device layer structure according to claim 1, further comprising an interfacial layer between the oxide layer and the second electrode.

4. The ferroelectric device layer structure according to claim 1, wherein the ferroelectric layer is a doped HZO layer.

5. The ferroelectric device layer structure according to claim 1, wherein the oxide layer is between 0.5 nm and 3 nm thick.

6. A ferroelectric device comprising:
the ferroelectric device layer structure according to claim 1; and
a doped semiconductor substrate having a front side and a back side, wherein the ferroelectric device layer structure is arranged on the front side.

7. A method for fabricating a ferroelectric device, wherein the method comprises:
forming a ferroelectric device layer structure comprising:
a first electrode;
a second electrode;
a ferroelectric layer of hafnium zirconate (HZO); and
an oxide layer of $Nb_2O_5$ or $Ta_2O_5$ arranged on the ferroelectric layer,
wherein the ferroelectric layer and the oxide layer are arranged between the first electrode and the second electrode; and
annealing the layers of the ferroelectric device layer structure at a temperature in a range of 350° C.-750° C. if the oxide layer is made of $Nb_2O_5$ and in a range of 350° C.-900° C. if the oxide layer is made of $Ta_2O_5$.

8. The method according to claim 7, further comprising:
depositing additional metal on the second electrode after the annealing step; and
patterning the metal to form the second electrode.

9. The method according to claim 7, wherein forming a ferroelectric device layer structure comprises:
depositing a metal for forming the first electrode on a front side of a semiconductor substrate;
depositing HZO for forming the ferroelectric layer on the first electrode;
depositing $Nb_2O_5$ or $Ta_2O_5$ for forming the oxide layer on the ferroelectric layer; and
depositing a metal for forming the second electrode.

10. The method according to claim 9, further comprising forming an aluminum layer on a back side of the semiconductor substrate.

11. The method according to claim 9, wherein the depositing steps use atomic layer deposition (ALD).

12. The method according to claim 11, wherein the ALD is performed with a reactor temperature in a range of 150° C.-450° C.

13. The method according to claim 11, wherein the ALD comprises plasma-enhanced ALD or thermal ALD.

14. A ferroelectric device formed according to a method comprising:
forming a ferroelectric device layer structure comprising:
a first electrode;
a second electrode;
a ferroelectric layer of hafnium zirconate (HZO); and
an oxide layer of $Nb_2O_5$ or $Ta_2O_5$ arranged on the ferroelectric layer,
wherein the ferroelectric layer and the oxide layer are arranged between the first electrode and the second electrode; and
annealing the layers of the ferroelectric device layer structure at a temperature in a range of 350° C.-750° C. if the oxide layer is made of $Nb_2O_5$ and in a range of 350° C.-900° C. if the oxide layer is made of $Ta_2O_5$.

15. The ferroelectric device according to claim 14, further comprising:
depositing additional metal on the second electrode after the annealing step; and
patterning the metal to form the second electrode.

16. The ferroelectric device according to claim 14, wherein forming a ferroelectric device layer structure comprises:
depositing a metal for forming the first electrode on a front side of a semiconductor substrate;
depositing HZO for forming the ferroelectric layer on the first electrode;
depositing $Nb_2O_5$ or $Ta_2O_5$ for forming the oxide layer on the ferroelectric layer; and
depositing a metal for forming the second electrode.

17. The ferroelectric device according to claim 16, further comprising forming an aluminum layer on a back side of the semiconductor substrate.

18. The ferroelectric device according to claim 16, wherein the depositing steps use atomic layer deposition (ALD).

19. The ferroelectric device according to claim 18, wherein the ALD is performed with a reactor temperature in a range of 150° C.-450° C.

20. The ferroelectric device according to claim 18, wherein the ALD comprises plasma-enhanced ALD or thermal ALD.

* * * * *